United States Patent
Yang et al.

(10) Patent No.: US 11,600,748 B2
(45) Date of Patent: Mar. 7, 2023

(54) DISPLAY SUBSTRATE AND MANUFACTURING METHOD T'HEREOF, DISPLAY PANEL AND DISPLAY DEVICE

(71) Applicant: BOE Technology Group Co., Ltd., Beijing (CN)

(72) Inventors: Shengji Yang, Beijing (CN); Xiaochuan Chen, Beijing (CN); Hui Wang, Beijing (CN); Pengcheng Lu, Beijing (CN)

(73) Assignee: BOE TECHNOLOGY GROUP CO., LTD., Biejing (CN)

( * ) Notice: Subject to any disclaimer, the term of this patent is extended or adjusted under 35 U.S.C. 154(b) by 332 days.

(21) Appl. No.: 16/959,169

(22) PCT Filed: Jul. 10, 2019

(86) PCT No.: PCT/CN2019/095481
§ 371 (c)(1),
(2) Date: Jun. 30, 2020

(87) PCT Pub. No.: WO2021/003716
PCT Pub. Date: Jan. 14, 2021

(65) Prior Publication Data
US 2021/0408332 A1 Dec. 30, 2021

(51) Int. Cl.
*G06F 3/044* (2006.01)
*H01L 27/15* (2006.01)
(Continued)

(52) U.S. Cl.
CPC ............ *H01L 33/38* (2013.01); *G06F 3/0412* (2013.01); *G06F 3/0443* (2019.05);
(Continued)

(58) Field of Classification Search
None
See application file for complete search history.

(56) References Cited

U.S. PATENT DOCUMENTS

| | | | |
|---|---|---|---|
| 10,254,791 B1 | 4/2019 | Ting | |
| 2019/0012012 A1 | 1/2019 | Lai et al. | |

(Continued)

FOREIGN PATENT DOCUMENTS

| | | | |
|---|---|---|---|
| CN | 107331680 A | 11/2017 | |
| CN | 109213360 A | 1/2019 | |

(Continued)

OTHER PUBLICATIONS

International search report of PCT application No. PCT/CN2019/095481 dated Apr. 15, 2020.

*Primary Examiner* — Duane N Taylor, Jr.
(74) *Attorney, Agent, or Firm* — Lippes Mathias LLP

(57) ABSTRACT

Provided is a display substrate including: a base substrate, a plurality of micro light-emitting diodes and a plurality of touch electrodes; wherein the micro light-emitting diode comprises: a first electrode, a light-emitting layer, and a second electrode that are sequentially arranged in a direction distal from the base substrate; and the touch electrode is disposed on a side of the micro LED distal from the base substrate. A manufacturing method of manufacturing a display substrate, a display panel, and a display device are also provided.

17 Claims, 8 Drawing Sheets

(51) Int. Cl.
    *H01L 33/04*      (2010.01)
    *H01L 33/62*      (2010.01)
    *G06F 3/041*      (2006.01)
    *H01L 25/16*      (2006.01)
    *H01L 33/38*      (2010.01)
    *H01L 33/32*      (2010.01)

(52) U.S. Cl.
    CPC .......... *G06F 3/0446* (2019.05); *G06F 3/0448* (2019.05); *H01L 27/156* (2013.01); *H01L 33/04* (2013.01); *H01L 33/32* (2013.01); *H01L 33/62* (2013.01); *G06F 2203/04103* (2013.01); *H01L 25/167* (2013.01); *H01L 2933/0016* (2013.01)

(56) References Cited

U.S. PATENT DOCUMENTS

| | | | |
|---|---|---|---|
| 2019/0012957 A1 | 1/2019 | Liu et al. | |
| 2019/0129555 A1 | 5/2019 | Chiang | |
| 2019/0384429 A1* | 12/2019 | Hsiao | ................. B81C 1/00595 |

FOREIGN PATENT DOCUMENTS

| | | |
|---|---|---|
| CN | 109213361 A | 1/2019 |
| CN | 109725781 A | 5/2019 |
| TW | 658446 B | 5/2019 |

* cited by examiner

DISPLAY SUBSTRATE AND MANUFACTURING METHOD T'HEREOF, DISPLAY PANEL AND DISPLAY DEVICE

CROSS-REFERENCE TO RELATED APPLICATION

The application is a 371 of PCT Application No. PCT/CN2019/095481 filed on Jul. 10, 2019, the entire contents of which are incorporated herein by reference.

TECHNICAL FIELD

The present disclosure relates to a display substrate and a manufacturing method thereof, a display panel, and a display device.

BACKGROUND

With the development of display technologies, various display panels have emerged, such as liquid crystal display panels, organic micro light-emitting diode display panels, and micro light-emitting diode display panels. The micro light-emitting diode display panel is regarded as the next-generation display panel due to its advantages of high brightness, high luminous efficiency, and low power consumption.

SUMMARY

Embodiments of the present disclosure provide a display substrate and a manufacturing method thereof, a display panel, and a display device. The technical solutions are as follows:

In one aspect, a display substrate is provided. The display substrate includes: a base substrate, a plurality of micro light-emitting diodes (LEDs), and a plurality of touch electrodes;

wherein the micro LED includes: a first electrode, a light-emitting layer, and a second electrode that are sequentially arranged in a direction distal from the base substrate; and the touch electrode is disposed on a side of the micro LED distal from the base substrate.

Optionally, the plurality of micro LEDs include a plurality of micro LED groups, wherein each of the micro LED groups includes at least one micro LED; and the touch electrodes one-to-one correspond to the micro LED groups, and each of the touch electrodes is electrically connected to the micro LED in the corresponding micro LED group.

Optionally, the touch electrode is electrically connected to the second electrode.

Optionally, the light-emitting layer includes: a first semiconductor layer, a quantum well layer, and a second semiconductor layer that are sequentially arranged in a direction distal from the base substrate;

wherein the first semiconductor layer is an N-type semiconductor layer, and the second semiconductor layer is a P-type semiconductor layer; or the first semiconductor layer is a P-type semiconductor layer, and the second semiconductor layer is an N-type semiconductor layer.

Optionally, the N-type semiconductor layer is an N-type gallium nitride layer, and the P-type semiconductor layer is a P-type gallium nitride layer.

Optionally, the touch electrode is in the shape of a right triangle; and the plurality of touch electrodes includes a plurality of touch electrode groups arranged in an array, and each of the touch electrode groups includes: two touch electrodes that are rotatably symmetric; wherein a rotation symmetry center of the two touch electrodes is between the two touch electrodes, and a rotation angle of the two touch electrodes is 180 degrees.

Optionally, the display substrate further includes: a plurality of touch traces one-to-one corresponding to the plurality of touch electrodes;

wherein each touch electrode is electrically connected to the corresponding touch trace, and an orthographic projection of the touch trace on the base substrate falls outside an orthographic projection of the multiple touch electrodes on the base substrate.

Optionally, the touch electrodes are in the shape pf a rectangle, and the plurality of touch electrodes are arranged in an array.

Optionally, the display substrate further includes: a plurality of touch traces one-to-one corresponding to the plurality of touch electrodes;

wherein each touch electrode is electrically connected to the corresponding touch trace, and an orthographic projection of the touch trace corresponding to each touch electrode on the base substrate overlaps with an orthographic projection of a row of touch electrodes where the touch electrode is disposed on the base substrate.

Optionally, the display substrate further includes: an insulating layer filled between adjacent micro LEDs.

Optionally, the display substrate further includes: a plurality of insulating support pillars;

wherein the plurality of insulating support pillars are disposed on a surface of the insulating layer distal from the base substrate, and in a direction perpendicular to the base substrate, a length of the insulating support pillar is greater than a thickness of the touch electrode.

Optionally, the display substrate further includes: a circuit layer disposed between the base substrate and the micro LEDs, wherein the circuit layer is electrically connected to the micro LEDs.

Optionally, in the micro LED, an orthographic projection of the second electrode on the base substrate falls within an orthographic projection of the first electrode on the base substrate, and an orthographic projection area of the second electrode on the base substrate is less than an orthographic projection area of the first electrode on the base substrate.

In another aspect, a method for manufacturing a display substrate is provided. The method includes:

forming a plurality of micro LEDs on a base substrate; and forming a plurality of touch electrodes on the base substrate on which the micro LEDs are formed;

wherein the micro LED includes: a first electrode, a light-emitting layer, and a second electrode that are sequentially arranged in a direction distal from the base substrate.

Optionally, before forming the plurality of micro LEDs on the base substrate, the method further includes:

forming the plurality of micro LEDs on a growth substrate; and forming the plurality of micro LEDs on the base substrate includes: transfer-printing each of the micro LEDs on the growth substrate to the base substrate.

Optionally, after forming the plurality of micro LEDs on the base substrate, the method further includes:

forming an insulating layer on the base substrate on which the micro LEDs are formed, the insulating layer being filled between adjacent micro LEDs; and forming a plurality of insulating support pillars on the insulating layer, in a direction perpendicular to the base substrate, the length of the insulating support pillar being greater than the thickness of the touch electrode; and forming the plurality of touch electrodes on the base substrate on which the micro LEDs are formed includes: forming the plurality of touch electrodes on the base substrate on which the micro LEDs, the insulating layer, and the support pillars are formed.

In yet another aspect, a display panel is provided. The display panel includes: the display substrate according to embodiments of the present disclosure.

Optionally, the display panel further includes: a cover plate covering the side where the touch electrodes of the display substrate are disposed.

In further another aspect, a display device is provided. The display device includes: the display panel according to embodiments of the present disclosure.

Optionally, the display device further includes: a control circuit, wherein the control circuit is electrically connected to a second electrode in the display panel, and the control circuit is configured to supply a display signal to the second electrode during a display phase, and supply a touch signal to the second electrode touch during a touch phase.

BRIEF DESCRIPTION OF THE DRAWINGS

In order to describe the technical solutions in the embodiments of the present more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

For clearer descriptions of the principles, technical solutions, and advantages in the present disclosure, specific embodiments of the present disclosure are described in detail hereinafter in combination with the accompanying drawings.

As known to the inventors, after the micro light-emitting diode display panel is attached to a touch panel, the whole formed by the micro light-emitting diode display panel and the touch panel is relatively thick. Therefore, the embodiments of the present disclosure provide a display substrate. The display panel including the display substrate not only has a touch function, but also has a smaller thickness.

Figure 1:
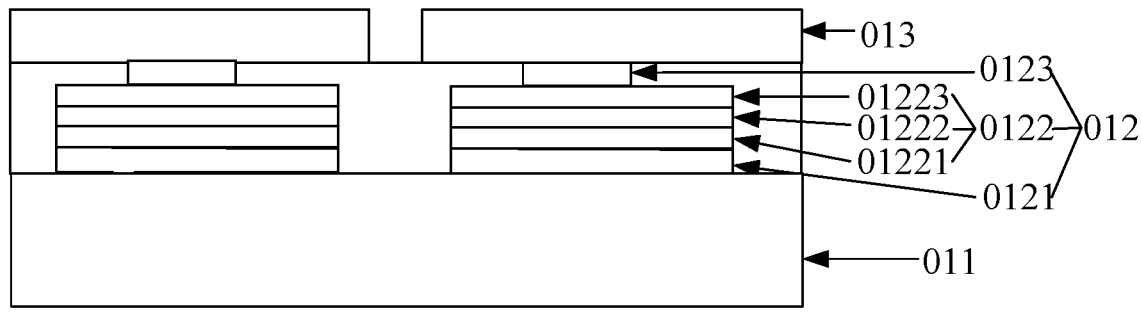
FIG. 1 is a schematic structural diagram of a display substrate according to an embodiment of the present disclosure.

Exemplarily, FIG. 1 is a schematic structural diagram of a display substrate according to an embodiment of the present disclosure. As shown in FIG. 1, the display substrate 01 may include: a base substrate 011 and a plurality of micro light-emitting diodes (LEDs) 012 (two micro LEDs 012 are shown in FIG. 1), and a plurality of touch electrodes 013 (two touch electrodes 013 are shown in FIG. 1). The micro LED 012 includes: a first electrode 0121, a light-emitting layer 0122, and a second electrode 0123 that are sequentially arranged in a direction distal from the base substrate 011.

It should be noted that in the first electrode 0121 and the second electrode 0123, one is an anode and the other is a cathode. In the embodiment of the present disclosure, the case where the first electrode 0121 is the anode and the second electrode 0123 is the cathode is taken as an example. Optionally, the first electrode 0121 may be the cathode, and the second electrode 0123 may be the anode, which is not limited in the embodiment of the present disclosure.

In summary, in the display substrate according to the embodiment of the present disclosure, the touch electrodes are disposed on the side of the light-emitting diodes distal from the base substrate, such that the touch electrodes are disposed in the display substrate. In this way, there is no need to superimpose the touch panel outside the display panel where the display substrate is disposed. Therefore, the thickness of the display panel where the display substrate according to the embodiment of the present disclosure is disposed is relatively small.

A size of the above micro LED 012 is less than a size of the LED. For example, a minimum size of the micro LED 012 may reach a micron level. The micro LED in the embodiment of the present disclosure may include: a micro LED or a mini LED It should be noted that the touch electrode 013 and the second electrode 0123 in the LED 012 may or may not be in contact, and the touch electrode 013 and the second electrode 0123 in the light-emitting diode 012 may or may not be electrically connected, which is not limited in the embodiment of the present disclosure. In FIG. 1, the case that the touch electrode 013 and the second electrode 0123 are in contact and electrically connected is taken as an example. In this case, a touch signal may be applied to the touch electrode through the second electrode to realize the touch function of the display substrate.

Optionally, the second electrode 0123 may also be electrically connected to a control circuit (not shown in FIG. 1). The working period of the control circuit may include a display phase and a touch phase. The control circuit may provide different signals to the second electrode 0123 respectively during the display phase and the touch phase, such that the second electrode 0123 plays different roles during the display phase and the touch phase. For example, the second electrode 0123 may function as an electrode for receiving a display signal during the display phase, and as an electrode for transmitting a touch signal to the touch electrode during the touch phase. In this way, the control circuit applies the touch signal to the touch electrode 013 during the touch phase to achieve the purpose of touch.

Still referring to FIG. 1, the above light-emitting layer 0122 may include: a first semiconductor layer 01221, a quantum well layer 01222, and a second semiconductor layer 01223 that are sequentially arranged in a direction distal from the base substrate 011. The first semiconductor layer 01221 is an N-type semiconductor layer, and the second semiconductor layer 01223 is a P-type semiconductor layer (in this case, the first electrode 0121 is a cathode and the second electrode 0122 is an anode); or the first semiconductor layer 01221 is a P-type semiconductor layer, and the second semiconductor layer 01223 is an N-type semiconductor layer (in this case, the first electrode 0121 is an anode and the second electrode 0122 is a cathode).

Illustratively, the materials of the N-type semiconductor layer 01221 and the P-type semiconductor layer 01223 may both include gallium nitride. In this case, the N-type semiconductor layer 01221 may be an N-type gallium nitride layer, and the P-type semiconductor layer may be a P-Type gallium nitride layer. The materials of the N-type semiconductor layer 01221 and the P-type semiconductor layer 01223 may not include gallium nitride, which is not limited in the embodiment of the present disclosure. The material of the above first electrode 0121 may be a reflective conductive material (for example silver). The material of the second electrode 0123 may be a transparent conductive material (for example, an indium tin oxide).

In the micro LED 012, an orthographic projection of the second electrode 0123 on the base substrate 011 falls within an orthographic projection of the first electrode 0121 on the base substrate 011. For example, an orthographic projection area of the second electrode 0123 on the base substrate 011 is less than an orthographic projection area of the first electrode 0121 on the base substrate 011. In this case, the micro LED 012 may be referred to as a perpendicular structure micro LED. Optionally, the orthographic projection area of the second electrode 0123 on the base substrate 011 may also be equal to the orthographic projection area of the first electrode 0121 on the base substrate 011, which is not limited in the embodiment of the present disclosure.

Figure 2:
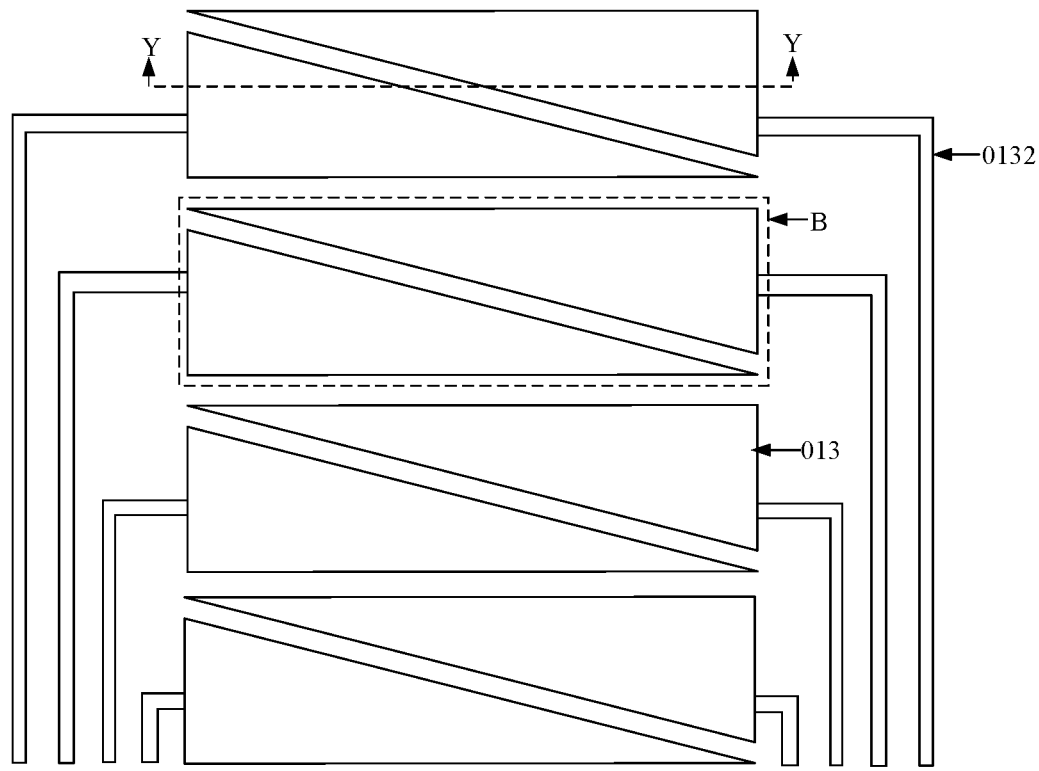
FIG. 2 is a top view of a touch electrode according to an embodiment of the present disclosure.

FIG. 2 is a top view of the touch electrode 013 according to an embodiment of the present disclosure, and FIG. 1 shows a structure of the section YY in FIG. 2. For example, the number of the touch electrodes 013 in FIG. 2 is greater than 1. With reference to FIG. 1 and FIG. 2, each touch electrode 013 corresponds to a group of micro LEDs 012 in the display substrate, and the touch electrode 013 may be electrically connected to the group of micro LEDs 012. Each group of micro LEDs includes at least one micro LED 012 (that is, the number of the micro LEDs 012 in each group of micro LEDs 012 is greater than or equal to one). Optionally, each touch electrode 013 is electrically connected to the second electrode 0123 in the corresponding micro LED 012.

Optionally, an orthographic projection of the micro LED corresponding to each touch electrode 013 on the base substrate 011 may fall within an orthographic projection of the touch electrode 013 on the base substrate 011.

The touch electrode 013 in the embodiment of the present disclosure may have a polygonal shape, such as a triangle, a rectangle, or a hexagon. The touch electrode 013 may not have a polygon shape. For example, the touch electrode 013 has a circular shape or an oval shape, which is not limited in the embodiment of the present disclosure.

Illustratively, FIG. 2 takes the touch electrode 013 having a right triangle shape as an example, n>1, and a plurality of touch electrodes 013 form a plurality of touch electrode groups 13 arranged in an array. Each touch electrode group B includes: two touch electrodes 013 which are rotatable symmetric, wherein a rotation symmetry center of the two touch electrodes 013 is between the two touch electrodes 013, and a rotation angle of the two touch electrodes 013 is 180 degrees. Still referring to FIG. 2, regardless of the shape of the touch electrode 013, the display substrate further includes: a plurality of touch traces 0132 one-to-one corresponding to the plurality of touch electrodes 013 (the touch traces are not shown in FIG. 1), and each touch electrode 013 may be electrically connected to the corresponding touch trace 0132. In FIG. 2, the case where an orthographic projection of the touch trace 0132 on the base substrate 011 falls outside an orthographic projection of the multiple touch electrodes 013 on the base substrate 011 is taken as an example. Optionally, the orthographic projection of the touch trace 0132 on the base substrate 011 may also overlap with the orthographic projection of the multiple touch electrodes 013 on the base substrate 011.

Figure 3:
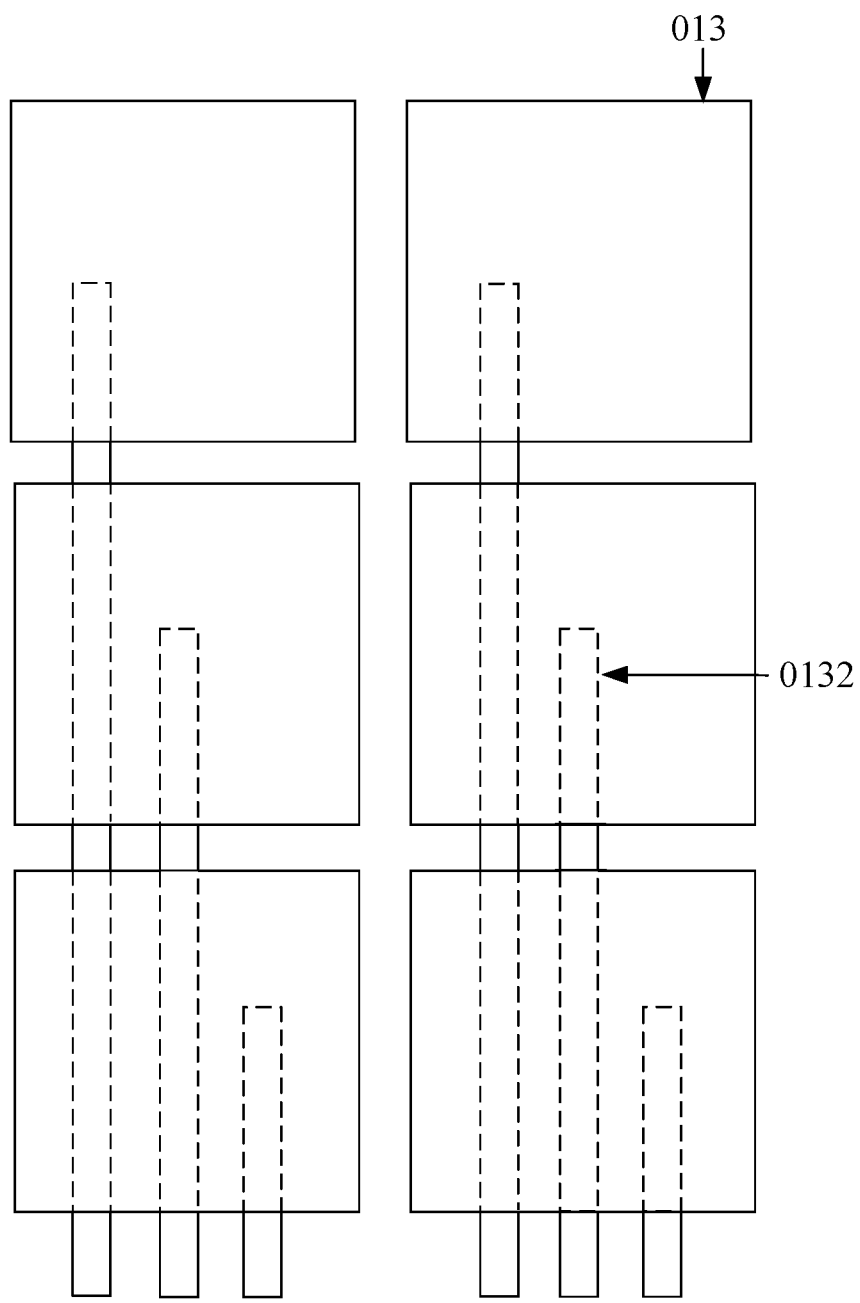
FIG. 3 is a top view of another touch electrode according to an embodiment of the present disclosure.

For another example, in FIG. 3, the touch electrodes 013 are rectangular, and the plurality of touch electrodes 013 is arranged in an array. FIG. 3 takes a square as an example of the above rectangle, and optionally, the rectangle may also be a rectangle shape, which is not limited in the embodiment of the present disclosure. The display substrate in FIG. 3 further includes: a plurality of touch traces 0132 one-to-one corresponding to the plurality of touch electrodes 013 one to one (the touch traces are not shown in FIG. 1). In addition, in FIG. 3, the orthographic projection of the touch trace 0132 electrically connected to each touch electrode 013 on the base substrate 011 overlaps with an orthographic projection of a row of touch electrodes 013, where the touch electrode 013 is disposed, on the base substrate 011.

In addition, as can be seen from FIG. 2 and FIG. 3, the touch electrodes in the embodiment of the present disclosure are evenly distributed, such that the touch electrodes are distributed in each area in the display panel, and each area of the display panel may achieve the touch function.

Further, when the touch electrodes are polygonal, the touch electrodes need to be separated from each other. In order to ensure the separation between the fingers of a user during touch, and to ensure effective touch of different fingers of the user, the length of the shortest side of the touch electrode ranges from 4 mm to 6 mm. For example, a length of the shorter right-angle side of the touch electrode in FIG. 2 needs to reach 4 mm to 6 mm, and a side length of the touch electrode in FIG. 3 needs to reach 4 mm to 6 mm.

Figure 4:
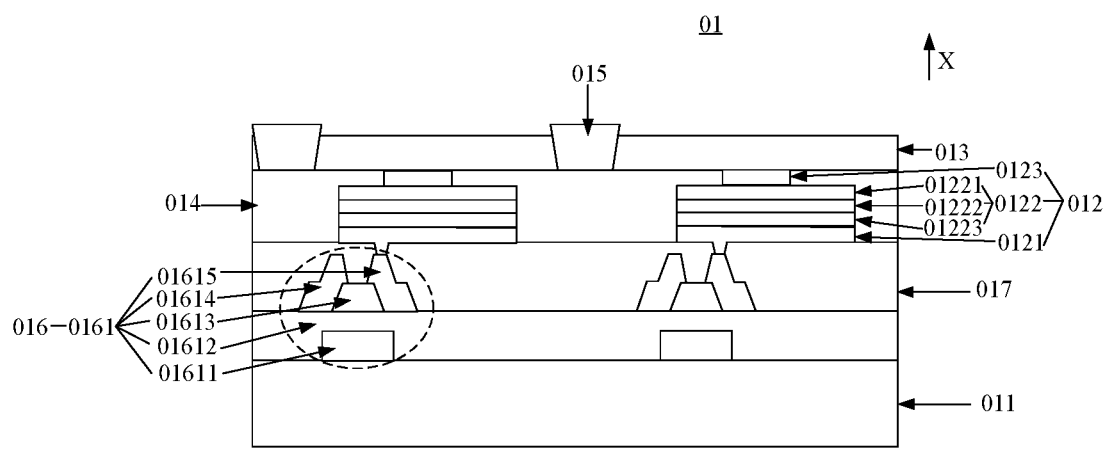
FIG. 4 is a schematic structural diagram of yet another display substrate according to an embodiment of the present disclosure.

FIG. 4 is a schematic structural diagram of another display substrate according to an embodiment of the present disclosure. As shown in FIG. 4, on the basis of FIG. 1, the display substrate 01 further includes an insulating layer 014. The insulating layer 014 is filled between adjacent micro LEDs 012.

Optionally, the display substrate 01 may further include: a plurality of insulating support pillars 015. The plurality of insulating support pillars 015 are disposed on a surface of the insulating layer 014 distal from the base substrate 011. In this case, the orthographic projection of the insulating support pillar 015 on the base substrate 011 falls outside the orthographic projection of each micro LED 012 on the base substrate 011. That is, the insulating support pillars 015 may be disposed between respective micro LEDs 012. In the direction X perpendicular to the base substrate 011, a length of the insulating support pillar 015 is greater than a thickness of the touch electrode 013. That is, the insulating support pillar 015 is higher than the touch electrode 013.

Optionally, the display substrate 01 further includes: a circuit layer 016 between the base substrate 011 and the micro LEDs 012. The circuit layer 016 includes a plurality of pixel circuits one-to-one corresponding to the micro LEDs 012 in the display substrate. The pixel circuit may include a transistor, or the pixel circuit may include a plurality of transistors and capacitors. FIG. 4 only shows the transistor 0161 in the pixel circuit as an example. The transistor 0161 may include: a gate electrode 01611, a gate insulating layer 01612; an active layer 01613, a source electrode 01614, and a drain electrode 01615. The drain electrode 01615 in each pixel circuit may be electrically connected to the first electrode 0121 in the micro LED 012 corresponding to the pixel circuit.

Optionally, the display substrate shown in FIG. 4 further includes a passivation layer 017. The passivation layer 017 is disposed between the circuit layer 016 and the micro LEDs 012. The first electrode 0121 of the micro LED 012 may be electrically connected to the drain electrode 01615 in the circuit layer 016 by a via hole in the passivation layer 017.

The specific structure of the pixel circuit and connection between the pixel circuit and the control circuit is explained hereinafter.

Figure 5:
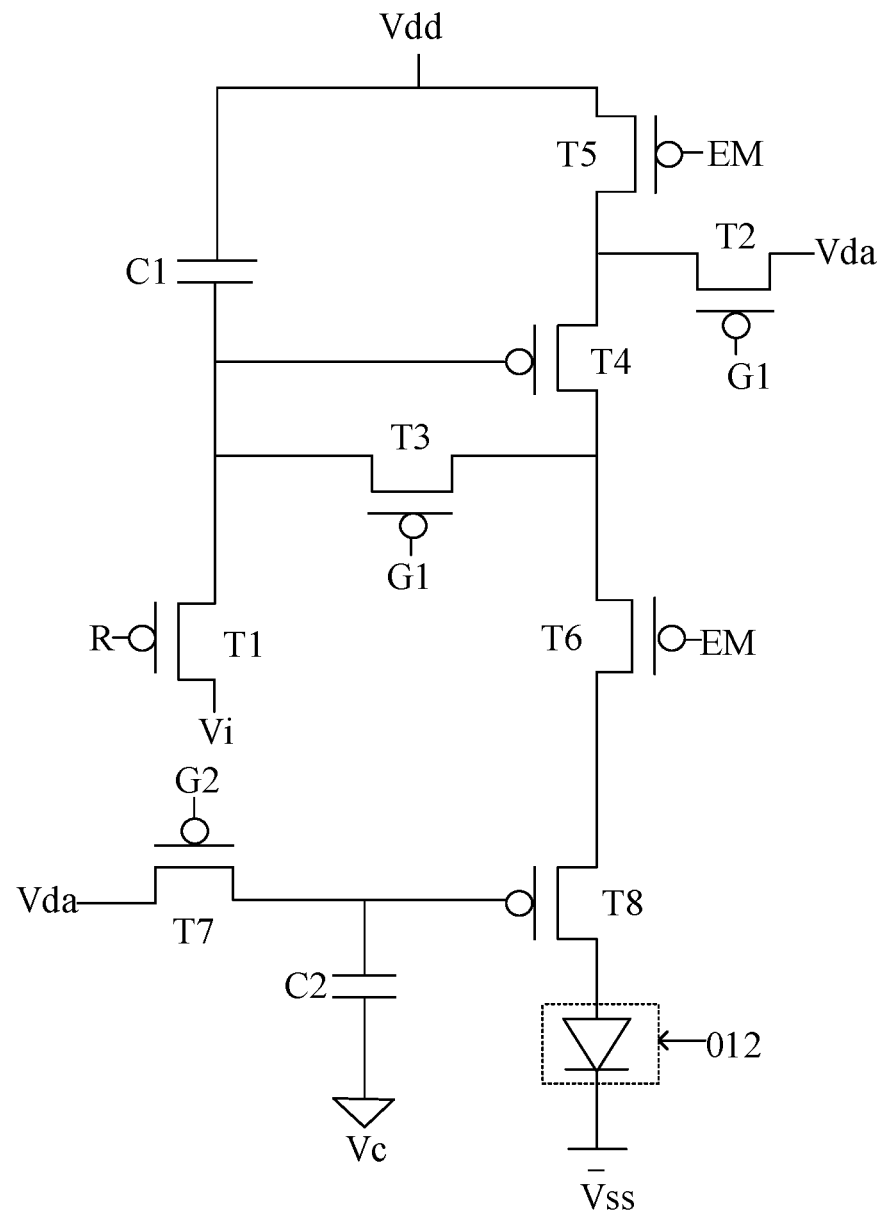
FIG. 5 is a schematic structural diagram of a pixel circuit according to an embodiment of the present disclosure.

FIG. 5 is a schematic structural diagram of a pixel circuit according to an embodiment of the present disclosure. As shown in FIG. 5, the pixel circuit may include: eight transistors and two capacitors. The eight transistors are: a first transistor T1, a second transistor T2; a third transistor T3, a fourth transistor T4, a fifth transistor T5, a sixth transistor T6, a seventh transistor T7, and an eighth transistor T8 respectively. Each transistor has a gate electrode, a first electrode, and a second electrode. When the first electrode is a source electrode, the second electrode is a drain electrode; and when the first electrode is a drain electrode, the second electrode is a source electrode. The two capacitors are a first capacitor C1 and a second capacitor C2 respectively.

It should be noted that the transistors in all the embodiments of the present disclosure may be thin film transistors, field effect transistors, or other devices with the same characteristics. Since the source electrode and the drain electrode of the transistor used here are symmetrical, the source electrode and the drain electrode are interchangeable. In the embodiment of the present disclosure, for distinguishing of the two electrodes of the transistor except the gate electrode, the source electrode is referred to as the first electrode, and the drain electrode is referred to as the second electrode. According to the form in the drawing, it is specified that the middle terminal of the transistor is the gate electrode, the signal input terminal is the source electrode, and the signal output terminal is the drain electrode. In addition, the transistor used in the embodiment of the present disclosure may be a P-type transistor or an N-type transistor, wherein the P-type transistor is turned on when the gate electrode is at a low level, and is turned off when the gate electrode is at a high level; and the N-type transistor is turned on when the gate electrode is at a high level, and is turned off when the gate electrode is at a low level. In the following embodiments, the P-type transistor is taken as an example of the transistor.

The control circuit may have a reset signal terminal R, an initialization signal terminal Vi, a gate electrode signal terminal G1, a gate electrode signal terminal G2, a data signal terminal Vda, a light emission control signal terminal EM, a first power supply signal terminal Vdd, a second power supply signal terminal Vss, and a common voltage signal terminal Vc. The pixel circuit may be electrically connected to these signal terminals of the control circuit.

Illustratively, the gate electrode of the first transistor T1 is connected to the reset signal terminal R, the first electrode of the first transistor T1 is connected to the initialization signal terminal Vi, and the second electrode of the first transistor T1 is connected to one terminal of the first capacitor C1. The gate electrode of the second transistor T2 is connected to the gate electrode signal terminal G1, the first electrode of the second transistor T2 is connected to the data signal terminal Vda, the second electrode of the second transistor T2 is connected to the second electrode of the fourth transistor T4. The gate electrode of the third transistor T3 is connected to the gate electrode signal terminal G1, the first electrode of the third transistor T3 is connected to one end of the first capacitor C1, and the second electrode of the third transistor T3 is connected to the first electrode of the fourth transistor T4. The gate electrode of the fourth transistor T4 is connected to one terminal of the first capacitor C1.

The gate electrode of the fifth transistor T5 is connected to the light emission control signal terminal EM, the first electrode of the fifth transistor T5 is connected to the first power supply signal terminal Vdd, and the second electrode of the fifth transistor T5 is connected to the second electrode of the fourth transistor T4. The gate electrode of the sixth transistor T6 is connected to the light emission control signal terminal EM, the first pole of the sixth transistor TG is connected to the first electrode of the fourth transistor T4, and the second electrode of the sixth transistor T6 is connected to the second electrode of the eighth transistor T8. The gate electrode of the seventh transistor T7 is connected to the gate electrode signal terminal G2, the first electrode of the seventh transistor T7 is connected to the data signal terminal Vda, and the second electrode of the seventh transistor T7 is connected to one terminal of the second capacitor C2. The gate electrode of the eighth transistor T8 is connected to one terminal of the second capacitor C2, the first electrode of the eighth transistor T8 is connected to the first electrode of the micro LED 012, and the second electrode of the micro LED 012 is connected to the second power supply signal terminal Vss.

The other terminal of the first capacitor C1 is connected to the first power supply signal terminal Vdd; and the other terminal of the second capacitor C2 is connected to the common voltage signal terminal Vc.

The control circuit may periodically control the micro LEDs. Each period in which the control circuit controls the micro LEDs may be divided into a display phase and a touch phase. The control circuit is configured to control the micro LEDs during the display phase to implement the display function of the display panel, and the control circuit is also configured to control the micro LEDs during the touch phase to implement the touch function of the display panel.

Figure 6:
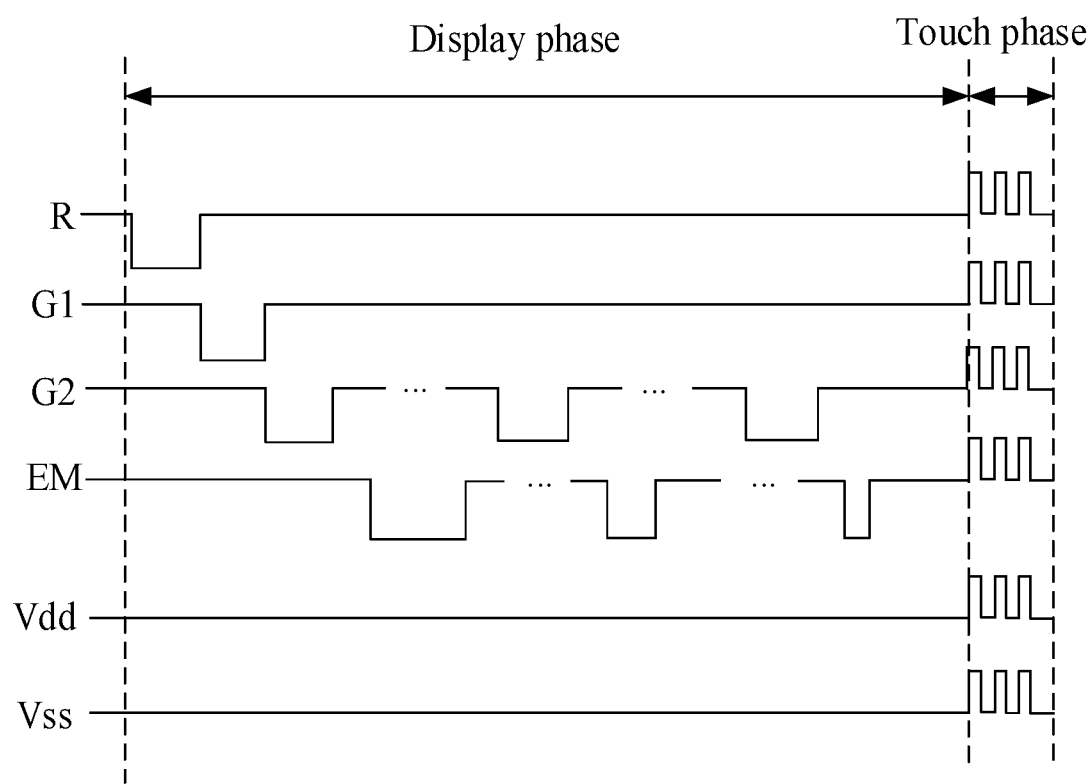
FIG. 6 is a schematic timing diagram of a control circuit according to an embodiment of the present disclosure.

Illustratively, FIG. 6 is a schematic timing diagram of a control circuit according to an embodiment of the present disclosure. As shown in FIG. 6, during the display phase, the reset signal terminal R, the initialization signal terminal Vi, the gate electrode signal terminal G1, the gate electrode signal terminal G2, the data signal terminal Vda, the light emission control signal terminal EM, the first power supply signal terminal Vdd, the second power supply signal terminal Vss, and the common voltage signal terminal Vc may output the display signal. It should be noted that the display signals supplied by these signal terminals of the control circuit may be the same or different from each other, which is not limited in the embodiment of the present disclosure. In the display phase, both the pixel circuit and the touch electrode in the micro LED sub-pixel may receive the display signal supplied by the control circuit, and the light-emitting layer in the micro LED may be controlled to emit light based on the received display signal, thereby realizing the purpose that the display panel displays an image.

Still referring to FIG. 6, during the touch phase, the signal terminal electrically connected to the touch electrode in the control circuit (for example the second power supply signal terminal Vss electrically connected to the second electrode) may supply a touch signal, such that the touch electrode in the micro LED sub-pixel receives the touch signal during the touch phase.

It should be noted that when the finger of the user touches the area where a certain micro LED sub-pixel is disposed in the display panel, the finger and the touch electrode in the micro LED sub-pixel form a capacitance, and such capacitance may change the charging time of the pixel circuit in the micro LED sub-pixel. In the embodiment of the present disclosure, the control circuit may also identify whether the area where the micro LED sub-pixel is disposed is touched by the user by detecting whether the charging time of the pixel circuit changes during the touch phase.

In addition, in order to prevent the influence on the light mission of the light-emitting layer caused by the signals on other structures (for example, the pixel circuit) in the micro LED sub-pixel, and improve the accuracy of the control circuit to detect whether the micro LED sub-pixel is touched, the control circuit may also provide the touch signal to the pixel circuit during the touch phase, and the touch signal is the same as the touch signal supplied by the control circuit to the touch electrode. Referring to FIG. 6, during the touch phase, the reset signal terminal R, the initialization signal terminal Vi, the gate electrode signal terminal G1, the gate electrode signal terminal G2, the data signal terminal Vda, the light emission control signal terminal EM, the first power supply signal terminal Vdd, the second power supply signal terminal Vss, and the common voltage signal terminal Vc may supply the same touch signal.

In summary, in the display substrate according to the embodiment of the present disclosure, the touch electrodes are disposed on the side of the LEDs distal from the base substrate, such that the touch electrodes are disposed in the display substrate. In this way, there is no need to superimpose the touch panel outside the display panel where the display substrate is disposed. Therefore, the thickness of the display panel where the display substrate according to the embodiment of the present disclosure is disposed is relatively small.

The embodiment of the present disclosure provides a display panel, which may include: the display substrate according to the embodiment of the present disclosure (for example the display substrate 01 shown in FIG. 1 or FIG. 4).

Figure 7:
FIG. 7 is a schematic structural diagram of a display panel according to an embodiment of the present disclosure.

Optionally, FIG. 7 is a schematic structural diagram of a display panel according to an embodiment of the present disclosure. As shown in FIG. 7, the display panel 10 may further include: a cover plate 02, which covers the side where the touch electrodes 013 of the display substrate 01 are disposed.

An embodiment of the present disclosure also provides a display device, which may include the display panel according to the embodiment of the present disclosure (for example the display panel shown in FIG. 7).

Figure 8:
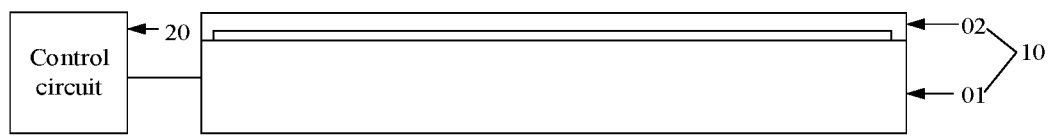
FIG. 8 is a schematic structural diagram of a display device according to an embodiment of the present disclosure.

Optionally, FIG. 8 is a schematic structural diagram of a display device according to an embodiment of the present disclosure. As shown in FIG. 8, the display device may further include: a control circuit 20. The control circuit 20 may be electrically connected to the second electrode in the display panel 10, and the control circuit 20 is configured to supply a display signal to the second electrode during the display phase and to supply a touch signal to the second electrode during the touch phase. Since the second electrode of the micro LED is electrically connected to the touch electrode, the touch electrode may receive the display signal during the display phase, and the touch electrode may receive the touch signal during the touch phase.

The control circuit may also be electrically connected to the pixel circuit, and may be configured to also supply the display signal to the pixel circuit during the above display phase, such that the light-emitting layer in the micro LED sub-pixel emits light under the actions of the display signals of the pixel circuit and the second electrode. In addition, the display signal supplied by the control circuit to the pixel circuit during the display phase may be different from the display signal supplied to the second electrode.

The control circuit may also detect whether the charging time of the pixel circuit has changed during the touch phase to identify whether the area of the micro LED sub-pixel where the pixel circuit is disposed in the display panel is touched. Optionally, the control circuit may also supply the touch signal to the pixel circuit during the touch phase. In addition, the touch signal supplied by the control circuit to the pixel circuit during the touch phase may be the same as the touch signal supply to the touch electrode, so as to reduce the influence on the signal of the touch electrode caused by other electrodes in the micro LED sub-pixel than the touch electrode.

In summary, in the display device according to the embodiment of the present disclosure, the touch electrodes are disposed on the side of the LEDs distal from the base substrate, such that the touch electrodes are disposed in the display substrate. In this way, there is no need to superimpose the touch panel outside the display panel where the display substrate is disposed. Therefore, the thickness of the display panel where the display substrate according to the embodiment of the present disclosure is disposed is relatively small.

Figure 9:
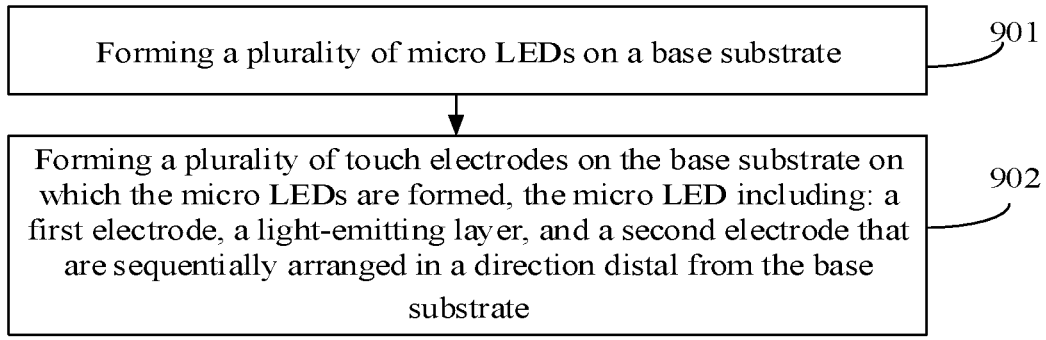
FIG. 9 is a flowchart of a method for manufacturing a display substrate according to an embodiment of the present disclosure.

FIG. 9 is a flowchart of a method for manufacturing a display substrate according to an embodiment of the present disclosure. The method may be employed to manufacture the display substrate according to the embodiment of the present disclosure (for example the display substrate shown in FIG. 1 or FIG. 4). As shown in FIG. 9, the method for manufacturing a display substrate may include:

In step 901, a plurality of micro LEDs are formed on a base substrate.

In step 902, a plurality of touch electrodes are formed on the base substrate on which the micro LEDs are formed, wherein the micro LED includes: a first electrode, a light-emitting layer, and a second electrode that are sequentially arranged in a direction distal from the base substrate.

In summary, in the display substrate manufactured by the method according to the embodiment of the present disclosure, the touch electrodes are disposed on the side of the LEDs distal from the base substrate, such that the touch electrodes are disposed in the display substrate. In this way, there is no need to superimpose the touch panel outside the display panel where the display substrate is disposed. Therefore, the thickness of the display panel where the display substrate according to the embodiment of the present disclosure is disposed is relatively small.

Figure 10:
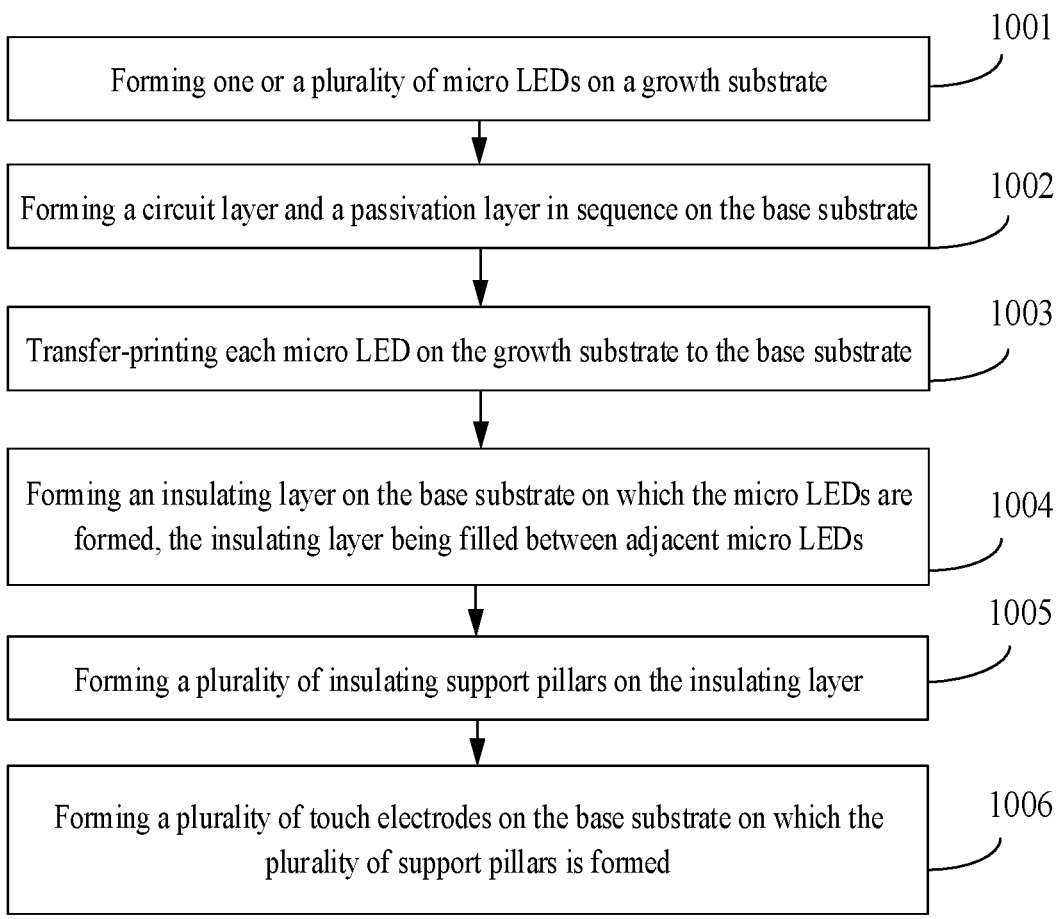
FIG. 10 is a flowchart of another method for manufacturing a display substrate according to an embodiment of the present disclosure.

FIG. 10 is a flowchart of another method for manufacturing a display substrate according to an embodiment of the present disclosure. The method may be employed to manufacture the display substrate according to the embodiment of the present disclosure (for example the display substrate shown in FIG. 4). As shown in FIG. 10, the method for manufacturing a display substrate may include:

In step 1001, a plurality of micro LEDs are formed on a growth substrate.

Figure 11:
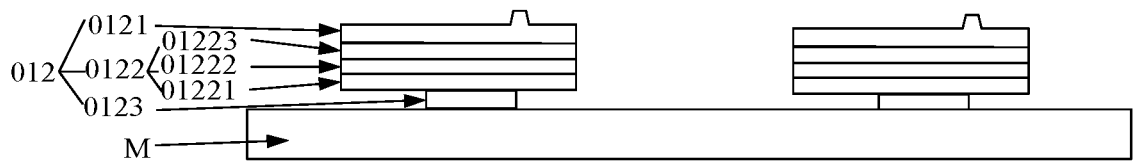
FIG. 11 is a schematic diagram of a manufacturing process of a display substrate according to an embodiment of the present disclosure.

It should be noted that the growth substrate and the base substrate in the display substrate are different substrates, and when each micro LED is formed on the growth substrate, it is necessary to sequentially form the second electrode, the light-emitting layer, and the first electrode in the micro LED. The plurality of micro LEDs 012 formed on the growth substrate M in step 1001 may be as shown in FIG. 11, and two micro LEDs 012 are shown in FIG. 11.

In step 1002, a circuit layer and a passivation layer are formed in sequence on the base substrate.

Figure 12:
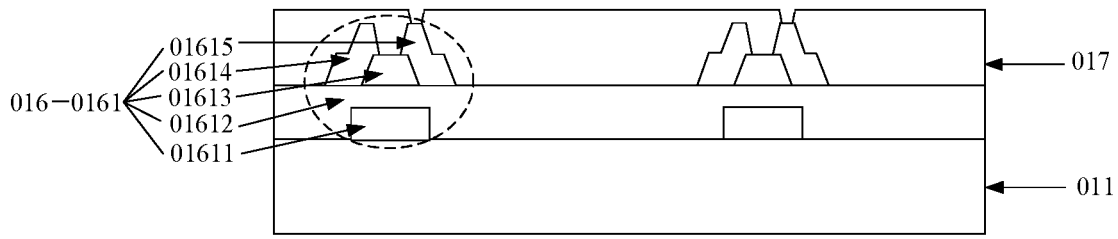
FIG. 12 is a schematic diagram of another manufacturing process of a display substrate according to an embodiment of the present disclosure.

After the above circuit layer is formed, an insulating material layer may be formed on the circuit layer at first, and then the insulating material layer is patterned to form via holes to obtain the passivation layer. For example, the circuit layer 016 and the passivation layer 017 formed on the base substrate 011 in step 1002 may be as shown in FIG. 12.

In step 1003, each micro LED on the growth substrate is transfer-printed to the base substrate.

Figure 13:
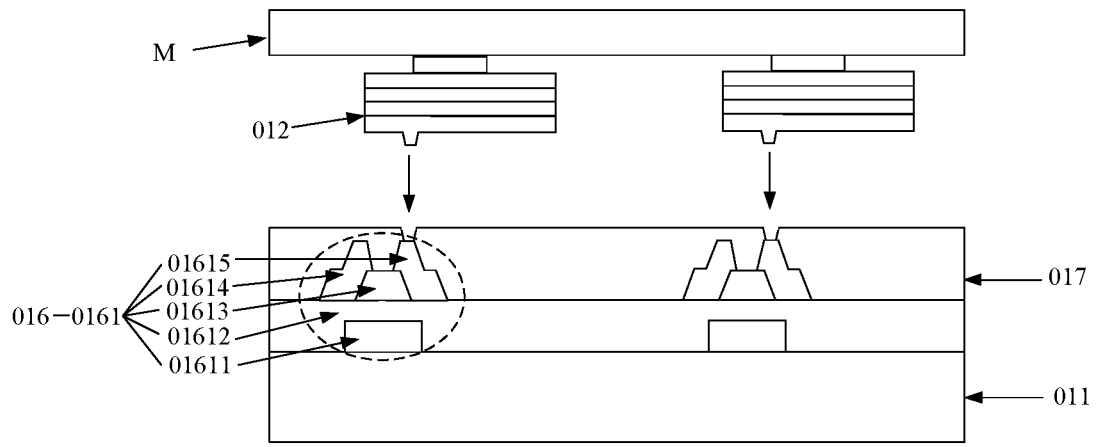
FIG. 13 is a schematic diagram of another manufacturing process of a display substrate according to an embodiment of the present disclosure.
Figure 14:
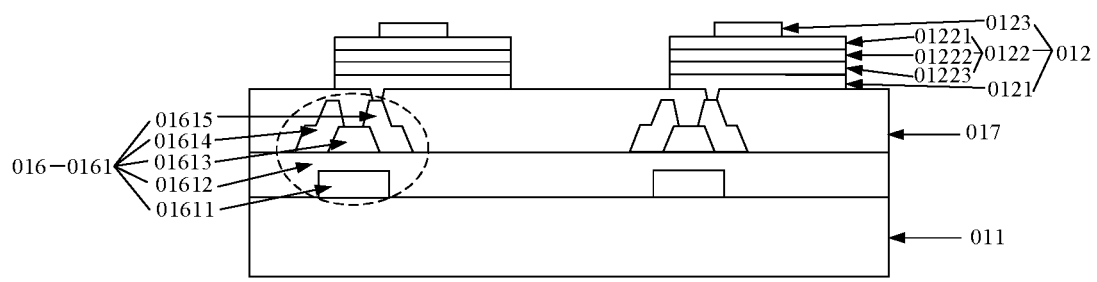
FIG. 14 is a schematic diagram of another manufacturing process of a display substrate according to an embodiment of the present disclosure.

After the insulating layer 014 is formed, as shown in FIG. 13, the micro LEDs 012 formed on the growth substrate may be transfer-printed to the surface of the passivation layer 017 to form the micro LEDs 012 as shown in FIG. 14 on the base substrate 011.

In step 1004, an insulating layer is formed on the base substrate on which the micro LEDs are formed, and the insulating layer is filled between adjacent micro LEDs.

Figure 15:
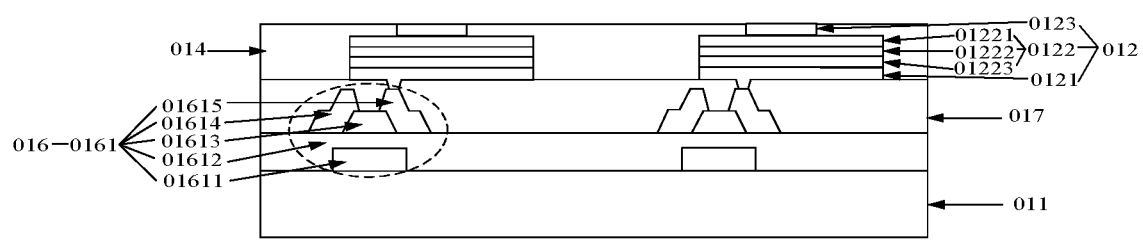
FIG. 15 is a schematic diagram of another manufacturing process of a display substrate according to an embodiment of the present disclosure.

After the above circuit layer, passivation layer, and micro LEDs are formed, an insulating material may be coated on the surface of the base substrate to form the insulating layer 014 shown in FIG. 15.

In step 1005, a plurality of insulating support pillars is formed on the insulating layer.

Figure 16:
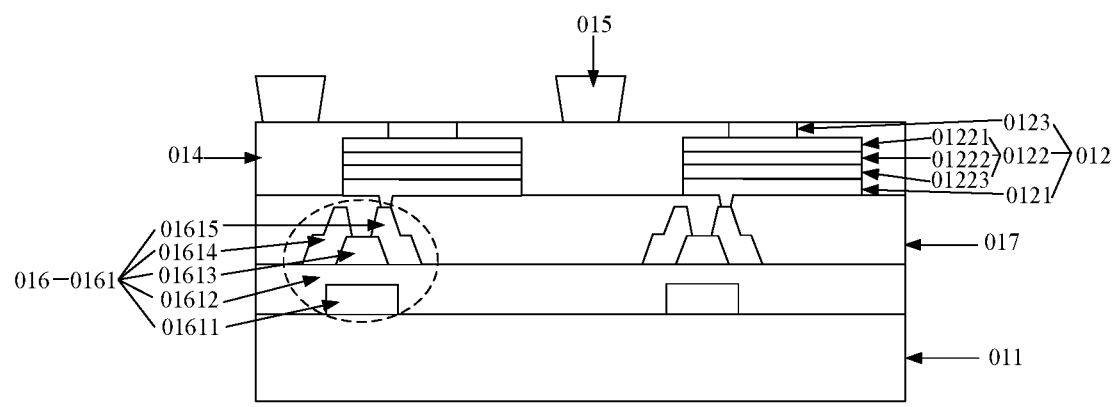
FIG. 16 is a schematic diagram of another manufacturing process of a display substrate according to an embodiment of the present disclosure.

After the insulating layer is obtained, the plurality of insulating support pillars 015 as shown in FIG. 16 may be continuously formed on the insulating layer. The insulating support pillars 015 may be formed by transfer printing or by patterning the film layer, which is not limited in the embodiment of the present disclosure.

In step 1006, a plurality of touch electrodes are formed on the base substrate on which plurality of support pillars are formed.

After the above circuit layer, passivation layer, micro LEDs, insulating layer, and plurality of support pillars are formed, a plurality of touch electrodes may be continuously formed on the base substrate to obtain the display substrate as shown in FIG. 4.

In summary, in the display substrate manufactured by the method according to the embodiment of the present disclosure, the touch electrodes are disposed on the side of the light-emitting diodes distal from the base substrate, such that the touch electrodes are disposed in the display substrate. In this way, there is no need to superimpose the touch panel outside the display panel where the display substrate is disposed. Therefore, the thickness of the display panel where the display substrate according to the embodiment of the present disclosure is disposed is relatively small.

It should be noted that in the drawings, the size of the structure may be exaggerated for clarity of illustration. It is understood that when a structure is referred to as being "on" another structure, the structure may be directly or indirectly on the other structure. In addition, when a structure is referred to as being "under" another structure, the structure may be directly or indirectly under the other structure. In addition, when a structure is referred to as being "between" two structures, the structure may be the only structure between the two structures, or there may be more than one other structure between the two structures. Similar reference signs indicate similar elements throughout.

In the present disclosure, the terms such as "first" and "second" are merely for a descriptive purpose, and cannot be understood as indicating or implying a relative importance. The term "a plurality of" means two or more in number, unless otherwise defined.

The method embodiments and the corresponding display substrate embodiments of the present disclosure may be cross referenced, which is not limited in the embodiments of the present disclosure. The sequence of the steps in the method embodiments may be adjusted appropriately, and the steps may be deleted or added according to the situation. Within the technical scope disclosed in the present disclosure, any variations of the method easily derived by a person of ordinary skill in the art shall fall within the protection scope of the present disclosure, which is not repeated here.

Described above are merely exemplary embodiments of the present disclosure, and are not intended to limit the present disclosure. Within the spirit and principles of the disclosure, any modifications, equivalent substitutions, improvements, or the like are within the protection scope of the present disclosure.

What is claimed is:

1. A display substrate, comprising: a base substrate, a plurality of micro light-emitting diodes and a plurality of touch electrodes; wherein the micro light-emitting diode comprises: a first electrode, a light-emitting layer, and a second electrode that are sequentially arranged in a direction distal from the base substrate; and the touch electrode is disposed on a side of the micro LED distal from the base substrate;

wherein the plurality of micro light-emitting diodes comprise a plurality of micro light-emitting diodes groups, each of the micro light-emitting diode groups comprising at least one micro light-emitting diode; and the touch electrodes one-to-one correspond to the micro light-emitting diode groups, and each of the touch electrodes is electrically connected to the micro light-emitting diode in the corresponding micro light-emitting diode group; and the touch electrode is electrically connected to the second electrode.

2. The display substrate according to claim 1, wherein the light-emitting layer comprises: a first semiconductor layer, a quantum well layer, and a second semiconductor layer that are sequentially arranged in the direction distal from the base substrate;
wherein the first semiconductor layer is an N-type semiconductor layer, and the second semiconductor layer is a P-type semiconductor layer; or the first semiconductor layer is a P-type semiconductor layer, and the second semiconductor layer is an N-type semiconductor layer.

3. The display substrate according to claim 2, wherein the N-type semiconductor layer is an N-type gallium nitride layer, and the P-type semiconductor layer is a P-type gallium nitride layer.

4. The display substrate according to claim 1, wherein the touch electrode is in the shape of a right triangle; and
the plurality of touch electrodes comprises a plurality of touch electrode groups arranged in an array, and each of the touch electrode groups comprises two touch electrodes that are rotatably symmetric; wherein a rotation symmetry center of the two touch electrodes is between the two touch electrodes, and a rotation angle of the two touch electrodes is 180 degrees.

5. The display substrate according to claim 4, further comprising: a plurality of touch traces one-to-one corresponding to the plurality of touch electrodes;
wherein each touch electrode is electrically connected to the corresponding touch trace, and an orthographic projection of the touch trace on the base substrate falls outside an orthographic projection of the multiple touch electrodes on the base substrate.

6. The display substrate according to claim 1, wherein the touch electrodes are in the shape of a rectangle, and the plurality of touch electrodes are arranged in an array.

7. The display substrate according to claim 6, further comprising: a plurality of touch traces one-to-one corresponding to the plurality of touch electrodes;
wherein each touch electrode is electrically connected to the corresponding touch trace, and an orthographic projection of the touch trace corresponding to each touch electrode on the base substrate overlaps with an orthographic projection of a row of touch electrodes, where the touch electrode is disposed, on the base substrate.

8. The display substrate according to claim 1, wherein the display substrate further comprises: an insulating layer filled between adjacent micro light-emitting diodes.

9. The display substrate according to claim 8, wherein the display substrate further comprises: a plurality of insulating support pillars;
wherein the plurality of insulating support pillars are disposed on a surface of the insulating layer distal from the base substrate, and in a direction perpendicular to the base substrate, a length of the insulating support pillar is greater than a thickness of the touch electrode.

10. The display substrate according to claim 1, wherein the display substrate further comprises: a circuit layer disposed between the base substrate and the micro LEDs, the circuit layer being electrically connected to the micro light-emitting diodes.

11. The display substrate according to claim 1, wherein in the micro light-emitting diode, an orthographic projection of the second electrode on the base substrate falls within an orthographic projection of the first electrode on the base substrate, and an orthographic projection area of the second electrode on the base substrate is less than an orthographic projection area of the first electrode on the base substrate.

12. A method for manufacturing a display substrate, comprising:
forming a plurality of micro light-emitting diodes on a base substrate; and
forming a plurality of touch electrodes on the base substrate on which the micro light-emitting diodes are formed;
wherein the micro light-emitting diode comprises: a first electrode, a light-emitting layer, and a second electrode that are sequentially arranged in a direction distal from the base substrate;
after forming the plurality of micro light-emitting diodes on the base substrate, the method further comprises:
forming an insulating layer on the base substrate on which the micro light-emitting diodes are formed, the insulating layer being filled between adjacent micro light-emitting diodes; and
forming a plurality of insulating support pillars on the insulating layer, in a direction perpendicular to the base substrate, a length of the insulating support pillar being greater than a thickness of the touch electrode; and
forming the plurality of touch electrodes on the base substrate on which the micro light-emitting diodes are formed comprises: forming the plurality of touch electrodes on the base substrate on which the micro light-emitting diodes, the insulating layer, and the support pillars are formed.

13. The method according to claim 12, wherein before forming the plurality of micro light-emitting diodes on the base substrate, the method further comprises:
forming the plurality of micro light-emitting diodes on a growth substrate; and
forming the plurality of micro light-emitting diodes on the base substrate comprises: transfer-printing each of the micro light-emitting diodes on the growth substrate to the base substrate.

14. A display panel, comprising a display substrate, wherein the display substrate comprises:
a base substrate, a plurality of micro light-emitting diodes and a plurality of touch electrodes: wherein
the micro light-emitting diode comprises: a first electrode, a light-emitting layer, and a second electrode that are sequentially arranged in a direction distal from the base substrate; and
the touch electrode is disposed on a side of the micro LED distal from the base substrate;
wherein the plurality of micro light-emitting diodes comprise a plurality of micro light-emitting diodes groups, each of the micro fight-emitting diode groups comprising at least one micro light-emitting diode; and
the touch electrodes one-to-one correspond to the micro light-emitting diode groups, and each of the touch electrodes is electrically connected to the micro light-emitting diode in the corresponding micro light-emitting diode group; and
the touch electrode is electrically connected to the second electrode.

15. The display panel according to claim 14, wherein the display panel further comprises: a cover plate covering a side where the touch electrodes of the display substrate are disposed.

16. A display device comprising: the display panel as defined in claim 14.

17. The display device according to claim 16, further comprising: a control circuit, wherein the control circuit is electrically connected to a second electrode in the display panel, and the control circuit is configured to supply a display signal to the second electrode during a display phase, and supply a touch signal to the second electrode touch during a touch phase.

\* \* \* \* \*